(12) United States Patent
Lacoste et al.

(10) Patent No.: US 9,750,120 B2
(45) Date of Patent: Aug. 29, 2017

(54) COAXIAL MICROWAVE APPLICATOR FOR PLASMA PRODUCTION

(71) Applicants: UNIVERSITE JOSEPH FOURIER—GRENOBLE 1, St. Martin d'Hères (FR); Jacques Pelletier, St. Martin d'Hères (FR)

(72) Inventors: Ana Lacoste, Saint Martin le Vinoux (FR); Jacques Pelletier, Saint Martin d'Hères (FR)

(73) Assignees: Universite Joseph Fourier—Grenoble 1, St. Martin D'Heres (FR); Jacques Pelletier, St. Martin D'Heres (FR)

( * ) Notice: Subject to any disclaimer, the term of this patent is extended or adjusted under 35 U.S.C. 154(b) by 160 days.

(21) Appl. No.: 14/413,559

(22) PCT Filed: Jul. 10, 2013

(86) PCT No.: PCT/EP2013/064574
§ 371 (c)(1),
(2) Date: Jan. 8, 2015

(87) PCT Pub. No.: WO2014/009410
PCT Pub. Date: Jan. 16, 2014

(65) Prior Publication Data
US 2015/0173167 A1    Jun. 18, 2015

(30) Foreign Application Priority Data
Jul. 11, 2012 (FR) ...................... 12 56677

(51) Int. Cl.
*C23C 14/28* (2006.01)
*H05H 1/46* (2006.01)
(Continued)

(52) U.S. Cl.
CPC ........... *H05H 1/46* (2013.01); *C23C 14/3471* (2013.01); *C23C 14/357* (2013.01);
(Continued)

(58) Field of Classification Search
CPC .................... C23C 14/3471; C23C 14/357
See application file for complete search history.

(56) References Cited

U.S. PATENT DOCUMENTS 5,053,678 A * 10/1991 Koike .................. H01J 27/18
                                                    204/298.38
5,230,784 A *  7/1993 Yoshida ............ H01J 37/32192
                                                    204/298.16
(Continued)

FOREIGN PATENT DOCUMENTS

WO    WO-2008/009558 A1    1/2008

OTHER PUBLICATIONS

Moisan, M. et al.; Physique des plasmas collisionnels—Application aux décharges haute fréquence (Physics of Collisional Plasmas—Application to High-frequency Discharges), EDP Sciences, Collection Grenoble Sciences, p. 215, 2006.
(Continued)

*Primary Examiner* — Jason M Berman
(74) *Attorney, Agent, or Firm* — Harness, Dickey & Pierce, PLC (57) ABSTRACT

The disclosure includes a coaxial microwave applicator for plasma production, including a coaxial tube formed by a central core and an outer conductor separated from the central core by an annular space allowing propagation of microwaves. The applicator includes: a cylindrical permanent magnet disposed at the end of the central core; and at least one annular permanent magnet disposed at the end of the outer conductor, all of the magnets disposed at the end of the coaxial tube having the same direction of magneti-
(Continued)

zation. The magnetization of the magnets forms a magnetic field suitable for generating, in a zone away from the end of the applicator, an electronic cyclotronic resonance coupling with the electric microwave field of the applicator. The external radius and the magnetization of the annular magnet are selected such that the magnetic field lines generated by the magnets pass through the coupling zone in a direction substantially parallel to the axis of the applicator.

22 Claims, 7 Drawing Sheets

(51) Int. Cl.
    *C23C 14/35*     (2006.01)
    *C23C 14/34*     (2006.01)
    *H01J 37/34*     (2006.01)
    *H05H 1/18*     (2006.01)

(52) U.S. Cl.
    CPC ........... *H01J 37/3405* (2013.01); *H05H 1/18* (2013.01); *H01J 2237/327* (2013.01); *H05H 2001/463* (2013.01); *H05H 2001/4622* (2013.01); *H05H 2242/10* (2013.01)

(56) References Cited

U.S. PATENT DOCUMENTS

| | | | |
|---|---|---|---|
| 6,225,592 B1 * | 5/2001 | Doughty | H01J 37/32192 |
| | | | 118/723 AN |
| 6,407,359 B1 | 6/2002 | Lagarde et al. | |
| 7,304,435 B2 | 12/2007 | Lacoste et al. | |
| 7,574,974 B2 | 8/2009 | Lagarde et al. | |
| 8,324,814 B2 * | 12/2012 | Pelletier | H01J 37/32192 |
| | | | 118/723 MR |
| 8,736,176 B2 | 5/2014 | Pelletier et al. | |

OTHER PUBLICATIONS

International Search Report for International Patent Application No. PCT/EP2013/064574 (in French).
Preliminary Search Report for French Patent Application No. 1256677 (in French).

* cited by examiner

COAXIAL MICROWAVE APPLICATOR FOR PLASMA PRODUCTION

CROSS-REFERENCE TO RELATED APPLICATIONS

This application is a National Phase Entry of International Application No. PCT/EP2013/064574, filed on Jul. 10, 2013, which claims priority to French Patent Application Serial No. 1256677, filed on Jul. 11, 2012, both of which are incorporated by reference herein.

TECHNICAL FIELD

The present invention relates to a coaxial microwave applicator for plasma production as well as a plasma production method in a pressure range which can extend from $10^{-2}$ Pa to $10^3$ Pa (that is on the order of $10^{-4}$ torr to about ten torr).

BACKGROUND

Production of plasma from a microwave electromagnetic field can be carried out using different mechanisms, depending on the pressure range considered, and whether or not a static magnetic field (as opposed to the magnetic component of the microwave electromagnetic field) is present. Below one torr (1 torr=133 Pa), in the presence of a sufficiently intense magnetic field, production of plasma by microwaves can be obtained in resonant coupling mode, called electron cyclotron resonance (ECR). At electron cyclotron resonance, the electrons are very effectively accelerated by the microwave electric field if the intensity of the magnetic field (which can be produced by coils or permanent magnets) is such that the frequency of gyration of the electrons in the magnetic field is equal to the frequency $f_0$ of the microwave electric field, hence:

$$f_0 = eB_0/2\pi m_e \quad (1)$$

where $m_e$ is the mass of the electron, $-e$ is the charge of the electron and $B_0$ the intensity of the magnetic field corresponding to electron cyclotron resonance (ECR) for the microwave frequency $f_0$.

In the absence of collisions, the trajectory of the so-called fast electrons thus accelerated at electron cyclotron resonance in the magnetic field, then coils in a helical motion around a magnetic field line, and each electron can thus oscillate between two mirror points where the speed of the electron parallel to the magnetic field line cancels and changes sign. Indeed, when the intensity of the magnetic field increases due to conservation of the magnetic moment of the electron on its trajectory (adiabatic invariant of the motion), the speed of the electron parallel to the field line decreases in favor of the speed of rotation about the magnetic field line (conservation of kinetic energy of the electron) until it cancels at the first mirror point, then changes direction heading for the second mirror point M, and so on. These mirror points M, where the intensity of the magnetic field is identical, are generally located facing two opposite magnetic poles of the same magnet (as in FIG. 1) or of two adjoining magnets (see FIG. 2).

Figure 1:
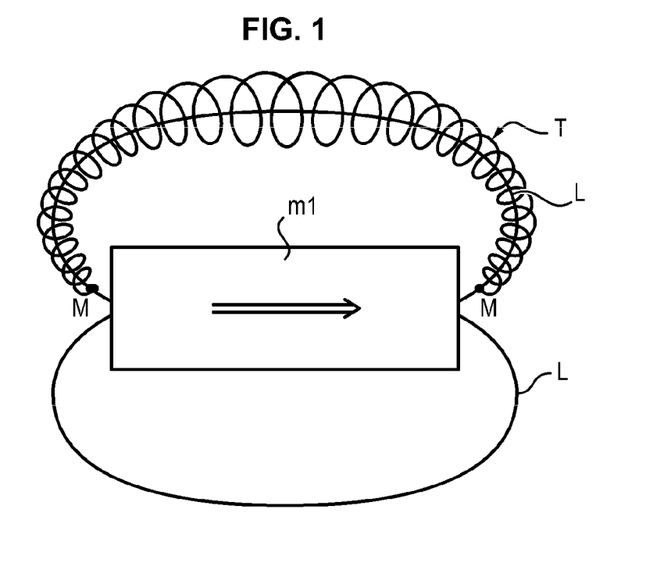
FIG. 1 is an outline schematic illustrating an electron trajectory in the presence of a single permanent magnet.
Figure 2:
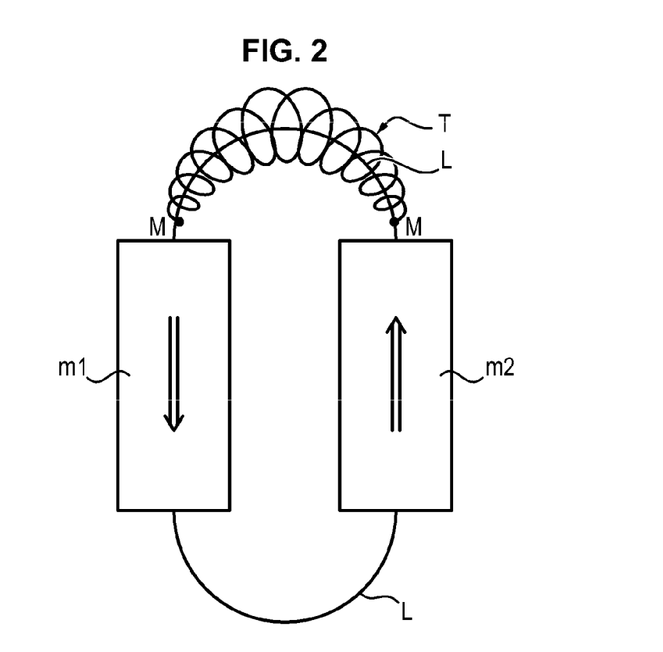
FIG. 2 is an outline schematic illustrating an electron trajectory in the presence of two adjoining permanent magnets with opposite magnetizations.

FIG. 1 illustrates a permanent magnet m1 with its magnetization direction shown schematically by the arrow. Two field lines L are shown and the trajectory T of an electron, which is driven in rotation about a field line L, is shown schematically on one of them. FIG. 2 illustrates two permanent magnets m1 and m2 arranged parallel to one another and with opposite magnetization directions, shown schematically by the arrows. In this case, the field lines L connect the adjoining poles of the two magnets, the trajectory of an electron being shown schematically on one of them.

The motion described above continues until the fast electron accelerated at electron cyclotron resonance undergoes collisions, and particularly ionizing collisions. The plasma, that is the electrons and the ions thus produced along the trajectories of the fast electrons accelerated at electron cyclotron resonance, then diffuses, by successive collisions, to either side of these trajectories, hence perpendicularly to the field lines.

Several devices using electron cyclotron resonance are described in documents FR 2 797 372, FR 2 838 020, FR 2 904 177, FR 2 904 178 and FR 2 938 150. Generally, these devices include magnetic structures with permanent magnets positioned at the exit of a coaxial microwave applicator (microwave applicator). These magnetic structures are such that all the fast electrons accelerated at electron cyclotron resonance oscillate between two mirror points M without encountering material surfaces capable of collecting them.

Thus the microwave power absorbed for accelerating them is entirely dedicated to plasma production by ionizing collisions, and not to bombarding surfaces interrupting their trajectory, giving an optimum efficiency with respect to plasma production by the fast electrons. All these devices have allowed microwave plasmas to be produced with excellent performance. At a higher pressure, above one-tenth of a torr (13.3 Pa) or one torr (133 Pa), that is when the frequency of collisions v of the electrons in the plasma reaches the order of magnitude of the microwave pulsation $\omega$ ($v \approx \Omega$), electron cyclotron resonance becomes less effective and heating of the electrons, that is their progressive acceleration in the microwave electric field, is accomplished for example by collision absorption immediately upon leaving the applicator. In this operating mode at higher pressure, above a few Pa, it is then necessary to avoid production inside the coaxial applicator by separating the volume under reduced pressure from the atmospheric pressure by a fluid-tight dielectric window directly at the exit of the applicator. Reference can be made in this regard to document FR 2 840 451.

Despite improvements applied to microwave applicators by the abovementioned documents, all these applicator have two major shortcomings, to wit:
- on the one hand, the fast electrons accelerated to electron cyclotron resonance remain trapped near the walls by the magnetic field between two mirror points situated near the poles: plasma production thus remains localized at the applicator exit, that is near the walls;
- on the other hand, the plasma produced by the fast electrons diffuses to either side of the trajectories of the fast electrons, that is perpendicularly to the magnetic field lines. As the probability of diffusing to one side or to the other of the trajectory of the fast electrons is the same, the probability for the plasma to diffuse toward the walls and that of diffusing away from the walls are statistically equal. It may then be considered that half the plasma produced by the fast electrons will be lost directly on the walls without filling the useful plasma volume situated beyond the trajectory moving away from the walls.

One goal of the invention is therefore to design a microwave coaxial applicator making it possible to correct these two shortcomings.

SUMMARY

A coaxial microwave applicator is proposed for plasma production, including an electrically conductive coaxial tube consisting of a central core and of an outer conductor surrounding the central core and separated therefrom by an annular volume for propagation of the microwaves. In conformity with the invention, said applicator includes:

- a cylindrical permanent magnet with its magnetization direction parallel to the axis of the applicator, positioned at the end of the central core, and
- at least one annular permanent magnet with its magnetization direction parallel to the axis of the applicator and with the same direction as the magnetization of the central cylindrical magnet, positioned at the end of the outer conductor,
- all the magnets positioned at the end of the coaxial tube having the same magnetization direction,
- the magnetization of said magnets being chosen so as to form a magnetic field suited for obtaining, in a region remote from the end of the applicator, electron cyclotron resonance coupling with the microwave electric field generated by said applicator,
- the outer radius and the magnetization of the annular magnet also being selected so that the magnetic field lines generated by said magnets run through the electron cyclotron resonance coupling region in a direction substantially parallel to the axis of the applicator.

The new applicator, which leaves the exit space free, also makes it possible to produce the plasma, not only at low pressure by electron cyclotron resonance, but also at higher pressure (where the magnetic field becomes much less effective), under coupling conditions of the collision absorption type for example. What is meant by electron cyclotron resonance is the situation wherein the intensity $B_0$ of the magnetic field produced by the permanent magnets positioned at the end of the applicator is such that the frequency of gyration of the electrons with mass $m_e$ and charge $-e$ in said magnetic field is equal to the frequency $f_0$ of the microwave electric field, hence:

$$f_0 = e\, B_0/2\, \pi m_e \qquad (1)$$

According to one embodiment, the outer radius of the annular magnet is at least twice the outer radius of the annular volume for propagation of the microwaves. According to one embodiment, the applicator includes, around the annular magnet, called the first annular magnet, a second annular permanent magnet with axial magnetization in the same direction as the magnetization of the central cylindrical magnet, said second annular magnet having a magnetic field intensity greater than that of the first annular magnet. Said first and second annular magnets can also consist of the same magnetic material, the length in the axial direction of the second annular magnet being greater than that of the first annular magnet. Alternatively, said first and second annular magnets have the same length in the axial direction and the material of the second magnet has a magnetization greater than that of the first annular magnet.

According to one embodiment, the applicator includes a shoulder covering an outer region of the end of the annular magnet, so as to limit radially the surface of the electron cyclotron resonance coupling region. The central core and/or the outer conductor of the coaxial tube can also include a circuit for circulating a cooling fluid.

According to one embodiment, the annular volume for propagation of the microwaves is sealed at the end of the applicator by a window made of dielectric material. According to another embodiment, the annular volume for microwave propagation is sealed, upstream of the end of the applicator, by a window made of dielectric material.

Advantageously, said annular volume for microwave propagation can be adapted for circulation of dielectric cooling fluid. Another object relates to a plasma production device including an enclosure containing a plasma gas and at least one applicator as described above, the end whereof bearing the permanent cylindrical and annular magnets leads into said enclosure.

According to one embodiment, said device includes a plurality of applicators, distributed within the enclosure so as to form a one-dimensional, two-dimensional or three-dimensional array. According to one embodiment, the permanent magnets of all said applicators have the same magnetization direction. In that case, the applicator array is advantageously surrounded by a magnetic structure having a magnetization direction parallel but opposite to that of the applicators. Alternatively, the applicator array is surrounded by a sputtering magnetron structure.

According to another embodiment, the permanent magnets of all said applicators have magnetization directions alternating from one applicator to another. Preferably, the absolute pressure within the enclosure is comprised between $10^{-2}$ Pa and $10^3$ Pa.

Another object relates to a method for producing plasma using microwaves in an enclosure containing a plasma gas, including propagation of microwaves into a coaxial microwave applicator as described previously leading into said enclosure and application, to the end of said applicator, of a magnetic field capable of providing electron cyclotron coupling with the microwave electric field within a region remote from the end of the applicator, the lines of said magnetic field passing through the electron cyclotron resonance coupling region in a direction substantially parallel to the axis of the applicator. The absolute pressure within the enclosure is preferably comprised between $10^{-2}$ Pa and $10^3$ Pa.

According to one embodiment, the absolute pressure inside the enclosure is less than 133 Pa, preferably less than 1 Pa, more preferably less than 0.1 Pa. According to one embodiment of the invention, the plasma is produced by means of a plurality of applicators distributed within the enclosure so as to form a one-dimensional, two-dimensional or three-dimensional array. Advantageously, the applicator is cooled by circulating a cooling fluid inside the central core of the applicator or in the microwave propagation volume. Preferably, the annular microwave propagation volume is sealed with a fluid-tight dielectric window at the end or upstream of the end of the applicator.

BRIEF DESCRIPTION OF THE DRAWINGS

Other features and advantages of the invention will emerge from the detailed description which follows, with reference to the appended drawings wherein.

DETAILED DESCRIPTION

The invention proposes a coaxial microwave applicator having, at its end, a magnetic structure which leaves the space at the exit of the applicator free and which allows plasma production not only at low pressure, by electron cyclotron resonance, but also at higher pressure, when the magnetic field becomes less effective, by collisional absorption type coupling for example. Generally, said magnetic structure is so designed that the magnetic field lines generated by this structure pass through the electron cyclotron resonance coupling region in a direction substantially parallel to the axis of the applicator. This coupling region can be defined by the intersection of two regions:

on the one hand, the magnetic field region situated in proximity to the surface of the magnetic field surface with intensity equal to $B_0$ ($B_0$ being the magnetic field intensity satisfying the ECR resonance condition for microwave electric field frequency $f_0$).

A region wherein the magnetic field intensity is comprised between $B_0-15\%$ and $B_0+15\%$ (or between $B_0-10\%$ and $B_0+10\%$) is usually considered, due to the broadening of the resonance due to collisions. By way of an example, at 2.45 GHz, where $B_0=875$ gauss (1 gauss=$10^{-4}$ Tesla), this region extends approximately from 750 to 1000 gauss.

Figure 3:
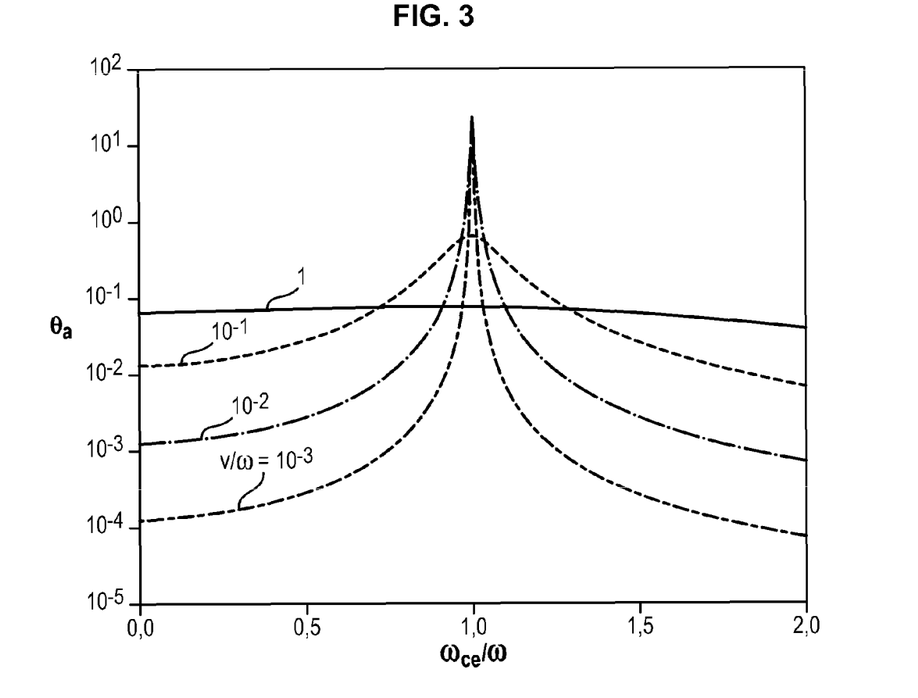
FIG. 3 is a graphic showing the evolution, with a constant electric field, of the power $\theta_a$ absorbed by the electron at different frequencies, for different values of the ration of the collision frequency v and the microwave pulsation $\omega$.

FIG. 3, which comes from the work of M. Moisan and J. Pelletier, *Physique des plasmas collisionnels—Application aux décharges haute fréquence [Physics of Collisional Plasmas—Application to High-frenquency Discharges]*, EDP Sciences, Grenoble Sciences collection, Les Ulis, France (2006), page 215, illustrates the evolution, for a constant magnetic field, of the power $\theta_a$ absorbed by the electron from $\omega_{ce}=0$, up to the resonance condition $\omega_{ce}=\omega$, and then beyond, for different values of the ratio $v/\omega$ (this ratio being able to be considered proportional to the pressure). This curve shows that resonance is strongly damped (manifested by broadening of the peak) as the frequency of collision increase or when moving away from resonance.

on the other hand, the microwave application region at the exit of the coaxial applicator.

Figure 4:
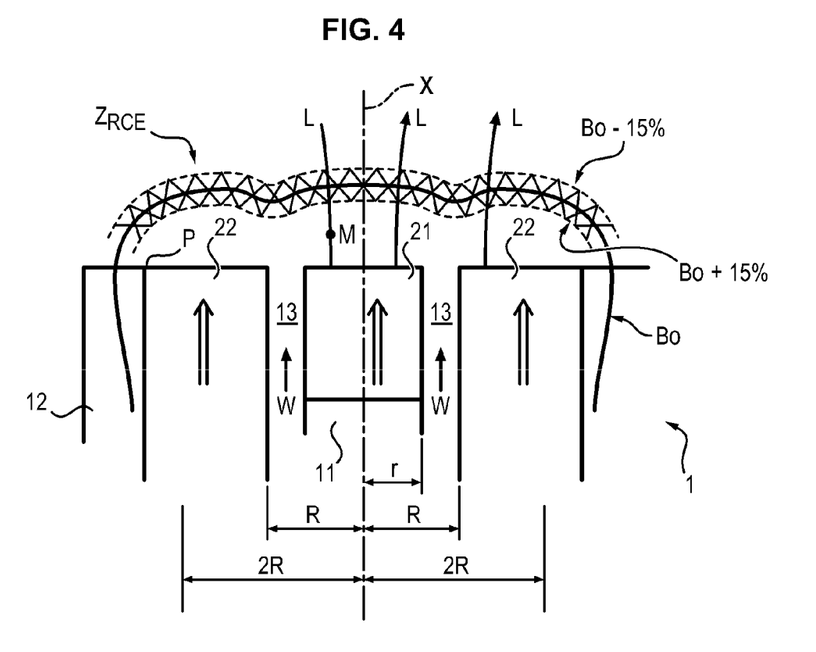
FIG. 4 is a schematic section of a microwave applicator according to a first embodiment of the invention.

This microwave application region encompasses the strong microwave field region located between the central core and the outer conductor of the coaxial applicator. This region extends in practice over a radius on the order of twice the radius of the applicator (which corresponds to the inner radius of the outer conductor). FIG. 4 illustrates an embodiment of an applicator conforming to the invention, and the magnetic structure whereof makes it possible to satisfy the condition defined above.

In a manner known per se, said applicator is a coaxial microwave applicator which includes an electrically conductive coaxial tube. Said coaxial tube consists of a central core 11 and of a (generally concentric) outer conductor 12 surrounding the central core 11 and separated therefrom by an annular volume 13 for propagation of the microwaves. The coaxial tube 11, 12 has axial symmetry about an axis X, also called the axis of the applicator. The ends of the central core 11 and of the annular outer conductor 12 are coplanar here, and constitute a plane called the exit plane of the applicator.

Conventionally, the applicator is supplied with microwaves by a microwave generator (not illustrated) which can be a magnetron or a solid-state source (transistors). The microwave frequencies employed can range from a hundred MHz or so up to tens of GHz, a range which includes the ISM (industrial, scientific and medical) frequencies of 433 MHz, 2.45 GHz and 5.80 GHz. Depending on the applications, the microwave frequency applied can range from one or a few watts (for lighting for example) to a few hundred watts or more (for treating gaseous effluents for example). Components such as a circulator (isolator), an impedance-matching device, a device for measuring incident and reflected power, etc., can be intercalated between the generator and the applicator. The design and the arrangement of these different components are within the reach of the person skilled in the art.

In conformity with the invention, said applicator also includes a cylindrical permanent magnet 21, positioned at the end of the central core 11 and with its magnetization direction (shown schematically by an arrow) is parallel to the axis X. Said magnet preferably has a radius substantially identical to that of the central core 11. Concretely, the radius of the cylindrical magnet can be slightly less than that of the central core and the central core can include a cylindrical recess (not illustrated here) at its end for accommodating the cylindrical magnet.

Moreover, the applicator also includes an annular magnet 22, positioned at the end of the outer conductor 12 of the coaxial tube and with its magnetization direction (shown schematically by an arrow) parallel to the axis X and concurrent with that of the cylindrical magnet 21. Preferably, said annular magnet has an inner radius equal to that of the outer conductor 12, which corresponds to the outer radius of the annular volume 13 for propagation of the microwaves, denoted R. Concretely, the inner radius of the annular magnet can be slightly greater than that of the outer conductor, while the inner radius of the annular magnet is less than that of the outer conductor, and the outer conductor can include an annular recess (not illustrated here) at its end to accommodate the annular magnet. The magnets can be permanently bonded to the coaxial tube by any appropriate means.

In the applicator conforming to the invention, all the magnets positioned at the end of the coaxial tube have the same magnetization direction, so that the field lines produced by said magnets in the central portion for applying the microwaves (that is in the region situated between the cylindrical magnet 21 and the annular magnet 22) have a substantially axial magnetization direction. The magnetization of the cylindrical magnet 21 and of the annular magnet 22 is selected so as to form a magnetic field capable of providing, in a region $Z_{RCE}$ remote from the end of the applicator, electron cyclotron resonance coupling with the microwave electric field generated by the applicator. This assumes that the magnetization of said magnets 21 and 22 is sufficient to generate, remotely from the exit plane P of the applicator, a magnetic field having intensity $B_0$ allowing electron cyclotron resonance as a function of the microwave frequency supplied, according to formula (1) presented in the introduction.

In particular, as already indicated above, the magnetizations of the magnets 21 and 22 are concurrent along the axis X. The person skilled in the art is able to select, among the commercially available magnets, those having adequate magnetization.

Purely by way of indication, for excitation of the plasma at electron cyclotron resonance by microwaves at 2.45 GHz, the resonance condition ($B_0$=875 gauss) requires magnets capable of supplying, in the exit plane of the applicator, a magnetic field having an intensity that may exceed 1000 gauss, for example 1500 to 2000 gauss, a value which can be easily supplied by conventional samarium-cobalt permanent magnets. The distance between the exit plane P of the applicator and the region wherein the magnetic field with intensity $B_0$ is obtained must be enough that the region $Z_{RCE}$, which corresponds to a region wherein the magnetic field is comprised between $B_0$+15% and $B_0$−15%, has good magnetic field uniformity.

Indeed, the annular volume 13 for microwave propagation, situated between the magnets 21 and 22, causes a local perturbation of the magnetic field, which decreases substantially at this annular volume. This perturbation tends to gradually decline with distance from the exit plane of the applicator so that, starting at a certain distance, the constant-intensity regions of the magnetic field are substantially parallel to the exit plane P of the applicator. The skilled person is able to simulate the variation in space of the intensity of the magnetic field generated by the magnets 21 and 22 and to deduce therefrom the magnetization required so that the region wherein the magnetic field is equal to $B_0$+15% is remote from the exit plane P of the applicator and substantially parallel to it.

It is moreover possible to minimize the perturbing effect of the annular volume 13 by minimizing the width thereof. Thus, preferably, the width of the annular volume 13 (that is the difference R−r between the inner radius R of the outer conductor 12 and the radius r of the central core 11) is less than the radius r of the central core 11, for example on the order of half or less of the radius r. Another way of minimizing the perturbing effect of the annular volume 13 is to increase the length of the magnets 21 and 22 (along the axis X). Generally, it is desirable, to minimize the perturbing effect of the annular volume 13, that the length of the magnets 21 and 22 (along the axis X) be, on the one hand, large compared to the difference R−r, and on the other hand, large compared to the radius r of the central core, for example with a length on the order of the diameter 2r of the central core.

On the other hand, another feature of the applicator according to the invention is to obtain magnetic field lines generated by the cylindrical magnet 21 and the annular magnet 22 which pass through the electron cyclotron resonance coupling region $Z_{RCE}$ in a direction substantially parallel to the axis X of the applicator. This effect can be obtained by judicious selection of the outer radius and of the magnetization of the annular magnet 22. Indeed, the greater the outer radius exhibited by the annular magnet 22, the more the constant-intensity lines of the magnetic field generated remotely from the applicator remain parallel to the exit plane P of the applicator over a large radius. Consequently, the region $Z_{RCE}$ being delimited, in the radial direction, by the region wherein the microwave electric field is strongest, the use of an annular magnet with an outer radius is much greater than the radius of that region makes it possible to obtain a region $Z_{RCE}$ substantially parallel to the exit plane P of the applicator.

As indicated above, it is considered that this strong electric field region extends over a radius on the order of twice the radius R of the applicator. Consequently, if the annular magnet 22 has an outer radius greater than 2R (see FIG. 4), the region $Z_{RCE}$, which corresponds to the intersection of the magnetic field region situated in proximity to the surface of the magnetic field with intensity equal to $B_0$ and of the microwave application region, is substantially parallel to the exit plane of the applicator over its entire extent of radius 2R. On the other hand, due to the presence of the annular magnet 22 having an outer radius greater than 2R, the field lines which originate at the pole located at the exit plane of the applicator remain substantially parallel to the axis X of the applicator in passing through the region $Z_{RCE}$ of radius 2R, up to the periphery of this region.

In other words, the annular magnet has the effect of "straightening" the field lines in the central portion of the region $Z_{RCE}$ of radius 2R. Purely by way of indication, the radius R of a microwave applicator is generally on the order of one cm, so that if an annular magnet is selected with an outer radius on the order of 2R to 3R, the diameter of the applicator is a few cm. It will be noted, however, that this dimensional condition applying to the annular permanent magnet corresponds only to a particular embodiment and it is possible, according to other embodiments described below, to obtain magnetic field lines parallel to the axis X in the region $Z_{RCE}$ with an annular magnet having a smaller outer radius.

Figure 5:
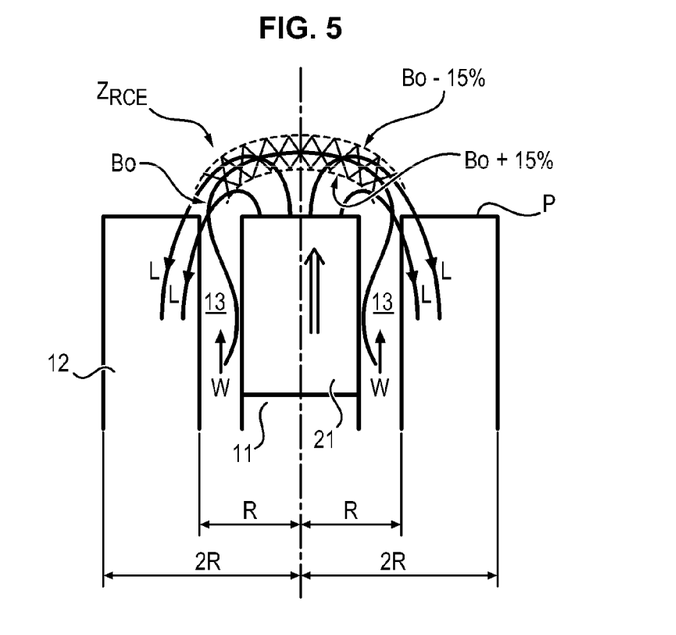
FIG. 5 is a schematic section of an applicator not conforming to the invention.

By way of comparison, FIG. 5 illustrates an applicator not conforming to the invention, that is one wherein the magnetic field lines L generated by the magnetic structure do not pass through the electron cyclotron resonance coupling region in a direction substantially parallel to the axis X of the applicator. In this example, a cylindrical permanent magnet 21 with axial magnetization (shown schematically by the arrow) is positioned in the central core 11 at the end of the microwave applicator with radius R. The ECR coupling region at the applicator exit is located at the intersection of the strong electric field region (with radius equal to 2R) and of the region wherein the magnetic field is nearly $B_0$, that is, as indicated previously, between $B_0$15% and $B_0$+15%.

It can be clearly observed that the magnetic field lines L, with the exception of those situated in proximity to the pole (that is the center of the applicator, which is assumed to have axial symmetry), do not pass through the ECR coupling region in a direction substantially parallel to the axis X of the microwave applicator and immediately loop back to the opposite pole of the magnet. In particular, this results in the fast electrons, the trajectories whereof coil around these magnetic field lines (that is those not passing through the coupling region in a direction substantially parallel to the axis of the microwave applicator) will be collected by the applicator at the exit plane. The power absorbed by these electrons will therefore be lost in bombardment of the material surface through which the field lines pass and not dissipated in producing plasma.

Returning now to the invention, the effect of the applicator on the electrons and on plasma generation will be described. In operation, the applicator leads into an enclosure containing a plasma gas. For example, the applicator is run fluid-tight through the wall of said enclosure, the exit plane (end of the applicator) being flush with the inner surface of said wall.

The plasma gas can be any gas, the components whereof allow a plasma to be generated under the influence of an applied electromagnetic wave. In applications relating to lighting, the plasma gas can thus consist, conventionally, of one or more rare gases (particularly argon) and mercury. By way of non-limiting examples, gases such as nitrogen, oxygen, halogenated gases or any other gas having useful physicochemical properties with a view toward a target application (treatment of effluents, surface treatments), can also be contemplated.

The electrons present, which are assumed to initially have low energy, are accelerated at ECR within the coupling region. These electrons thus acquire a high rotation speed, and consequently a high rotation energy compared with the initial translation energy parallel to the magnetic field line.

It can therefore be considered that the mirror point corresponding to a speed having a zero parallel component is located, for each electron trajectory, on the field line which guides the trajectory, at a magnetic field value slightly higher than in the coupling region $Z_{RCE}$, that is closer to the magnetic pole and to the exit plane P of the applicator. If the direction of the initial parallel speed is oriented toward the exit plane P of the applicator, the electron accelerated at ECR in the coupling region first moves toward the mirror point M before being reflected there and then moving away from it. If the direction of the initial parallel speed is oriented in the direction opposite to the exit plane P of the applicator, the electron accelerated at ECR continues to move away from the exit plane of the applicator, without being reflected at the mirror point M.

Due to the fact that, as indicated previously, the ECR coupling region was chosen sufficiently remote from the exit plane of the applicator, all the fast electrons accelerated at ECR end up (without reflection, or after reflection at the mirror point M) moving away from the exit plane of the applicator, and none of the fast electrons will be collected by the different material surfaces of the applicator. When the fast electrons are moving away from the exit plane of the applicator, that is when they are moving away from the polar surface of the permanent magnets, the intensity of the magnetic field decreases. In their helical motion about a field line, the kinetic energy of rotation of the electrons is then gradually transformed into kinetic energy of translation parallel to the field lines, whence the occurrence of acceleration of motion along the field lines.

Naturally, along their trajectories, these fast electrons created plasma, that is slow electrons and ions, through ionizing collisions. Due to the space charge created by the fast electrons, the ions are in their turn accelerated along the magnetic field lines toward the magnetic fields with decreasing intensity (moving away from the mirror points M). As a result of all these mechanisms, plasma is primarily produced beyond the mirror points M of the fast electrons defined previously, and diffusion of the plasma takes place preferentially into the volume facing the exit plane P of the applicator, and not toward the applicator. Considering the plasma production and diffusion mechanisms, the loss of fast electrons and plasma to the applicator are considerably reduced, resulting in high effectiveness of the applicators conforming to the invention compared to other types of microwave applicators.

At higher pressures, where the magnetic field is no longer effective, that is when the microwave pulsation $\omega = 2\pi f_0$ is of the same order as the frequency of collision $\nu$ of the electrons ($\nu \approx \omega$), the coupling of the microwave power with the electrons, for example by collisional absorption is substituted for ECR resonant coupling. In that case, the fact that the magnetic structure leaves the half-space beyond the exit plane P of the applicator free makes it possible to obtain, at the applicator exit, beyond a dielectric window (making it possible to separate the low-pressure volume beyond the exit plane of the applicator from atmospheric pressure), a plasma disk. Said window takes the form of a ring of dielectric material positioned fluid-tight within the annular propagation volume.

At low pressure (that is below a pressure on the order of one Pa), ignition of the plasma within the coaxial applicator within a space of a few mm between the central core and the outer conductor cannot occur (Paschen's law), hence the possibility, in this case, of positioning the fluid-tight window with a set-back (that is upstream on the microwave path) from the exit plane of the applicator. Applicators conforming to the invention make it possible, on the one hand, to produce plasma using extended operating conditions (pressure, frequency, power) and, on the other hand, to considerably reduce the losses at low pressure under ECR coupling conditions.

Figure 6:
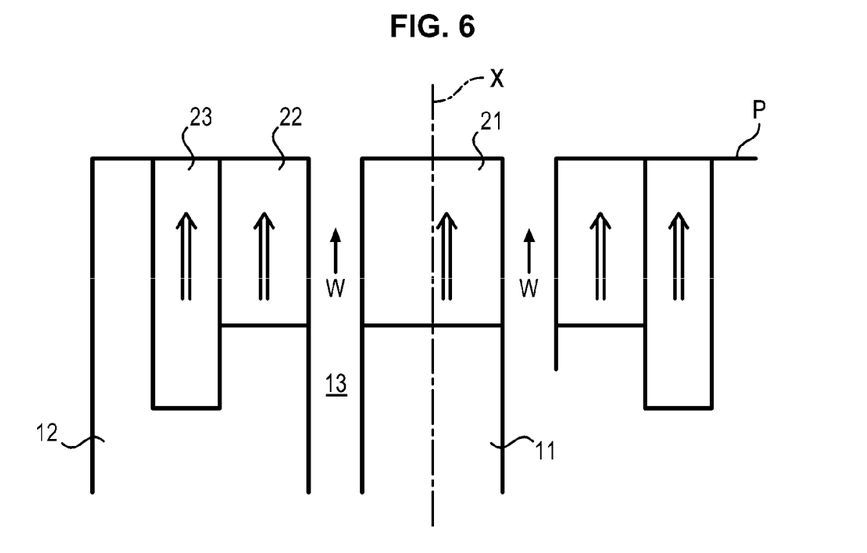
FIG. 6 is a schematic section of a microwave applicator according to a second embodiment of the invention.

Advantageous embodiments of the invention will now be described, with reference to FIGS. 6 through 8. FIG. 6 shows an embodiment allowing the radial dimension of the applicator to be reduced by reducing the outer radius of the annular magnet compared to the embodiment shown in FIG. 4. Indeed, the "straightening" of the field lines at the periphery of the region $Z_{RCE}$ can also be obtained by using two concentric annular magnets, of which the one situated outside provides, at the exit plane of the applicator, a magnetic field intensity greater than that provided by the magnet situated inside; the radial dimension of the outer annular magnet being less than that of a single annular magnet as used in the embodiment FIG. 4.

In FIG. 6, the cylindrical magnet 21 is shown placed at the end of the central core 11, which does not differ from the magnet described with reference to FIG. 4, and two annular magnets 22 and 23, the magnet 23 surrounding the magnet 22. As mentioned above, the two annular magnets can be housed in a suitably dimensioned annular recess (not illustrated here) provided at the end of the outer conductor. The higher magnetic field intensity of the outer magnet 23 can be obtained, for a magnetic material identical to that of the inner magnet 22, by a greater length along the axis X for the outer magnet 23 than for the inner magnet 22 (case illustrated in FIG. 6).

Alternatively (not illustrated), this magnetic intensity can be obtained with inner and outer magnets of equal length, but with a magnetic material for the outer magnet having a higher magnetization. The use of these two annular magnets thus makes it possible to obtain a more compact applicator, its total radius being reduced.

Figure 7:
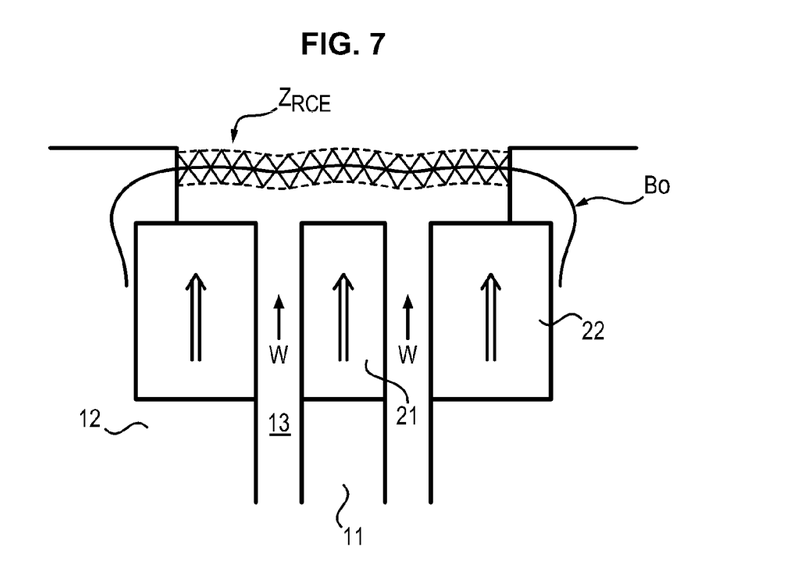
FIG. 7 is a schematic section of a microwave applicator according to a third embodiment of the invention.

FIG. 7 has another embodiment making it possible, within the scope of low pressure ECR operation, to reduce the radial dimension of the applicator by reducing the radius of the coupling region $Z_{RCE}$ compared with the embodiment illustrated in FIG. 4. It is in fact possible to delimit the coupling region $Z_{RCE}$ by means of material surfaces. For example, as illustrated in FIG. 7, an annular shoulder 14 partially covering the annular magnet 22 and having a height (in the X direction) at least equal to the distance between the region $Z_{RCE}$ and the exit plane P of the applicator is arranged.

Said shoulder can for example consist of a portion of the outer conductor 12. The coupling region $Z_{RCE}$ wherein the magnetic field lines must be parallel to the axis X is therefore more limited in the radial direction and, even though the annular magnet is less bulky, the field line situated at the periphery of the region $Z_{RCE}$ remain parallel to the axis X. At high pressure, however, it is preferable to leave free the space in front of the applicator; such a shoulder is thereby avoided.

Figure 8:
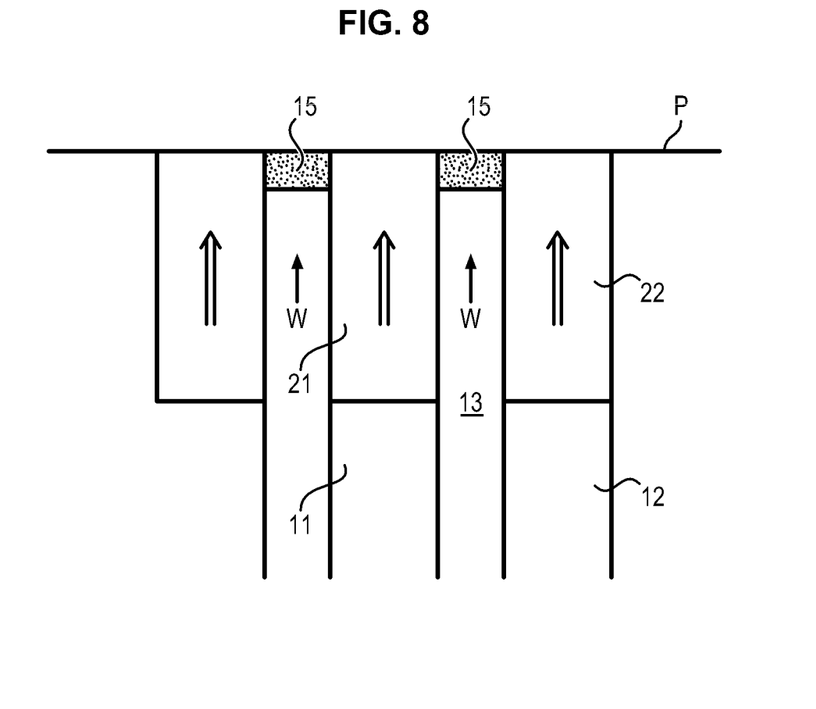
FIG. 8 is a schematic section of a microwave applicator according to an embodiment of the invention incorporating circulation of a cooling fluid.

FIG. 8 illustrates an embodiment allowing cooling of the applicator, which may be necessary when implementing high microwave power. Thus, a dielectric fluid can be circulated inside the annular volume 13 for microwave propagation, having previously sealed this volume fluid-tight at the exit plane of the applicator, for example with a window 15 made of a dielectric material. Alternatively (not illustrated), it is possible to cool the central core and/or the outer conductor by circulating a suitable fluid (water for example) inside the central core and/or the outer conductor.

The definition and implementation of channels allowing such circulation is known per se and within the reach of the person skilled in the art depending on the technical constraints encountered. Naturally, these different embodiments can possibly be combined by the person skilled in the art depending on the technical constraints encountered, particularly in terms of power, required size, etc.

Among the applications of applicators conforming to the invention can be mentioned lighting, extended plasma sources for surface treatments, applications to etching (microelectronics and nanotechnologies), treatment of gaseous effluents, plasma sterilization, ion sources, ion propulsion (list is not limiting). Depending on the applications, applicators such as those described above can be employed unitarily. Such is the case for example in lighting, where an applicator is inserted into a bulb containing a plasma gas allowing emission of UV or of visible radiation.

Another example is the use of the applicator as a point ion source. Other applications, however, such as treating large surfaces, the formation of extended ion sources, production of uniform plasma volumes, can require a plurality of applicators to form an extended plasma source. In that case, the applicators can be arranged in arrays with one dimension (that is to say aligned to form a linear source), with two dimensions (all of the exit planes being distributed over a single surface to form a planar source) or with three dimensions (the exit planes of the different applicators belonging to different planes surrounding a plasma volume).

The arrangement of the applicators relative to one another and the distance between applicators is defined by the person skilled in the art depending on the intended application. Moreover, depending on the case, two adjoining applicators can have concurrent magnetizations (for example in the case of an extended ion source) or alternating ones (in certain cases of confining a volume of plasma).

In the case of applicator distributions in a one-dimensional (linear), two-dimensional (planar surface) or three-dimensional (surface enclosing a volume) array to implement lines, surfaces or large volumes of plasma, the case of distributions of applicators with magnetic fields alternating between an applicator and its neighbor(s) does not present any real problem with regard to closure of the magnetic field at the boundaries of the array. In contrast, in the case of distributions of applicators having all axial magnetizations concurrent, closure of the magnetic field at the periphery of the array can be obtained, depending on the application, according to one of the embodiments described below.

Figure 9A:
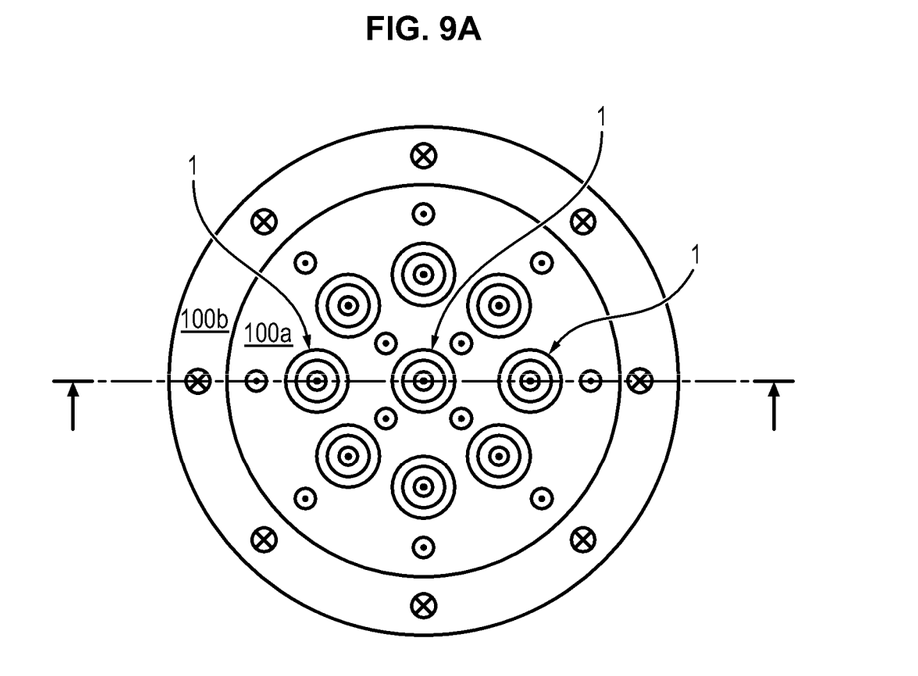
FIG. 9A is a top view of an array of applicators all having the same magnetization direction and of a magnetic structure allowing the magnetic field to be closed at the periphery of the array.
Figure 9B:
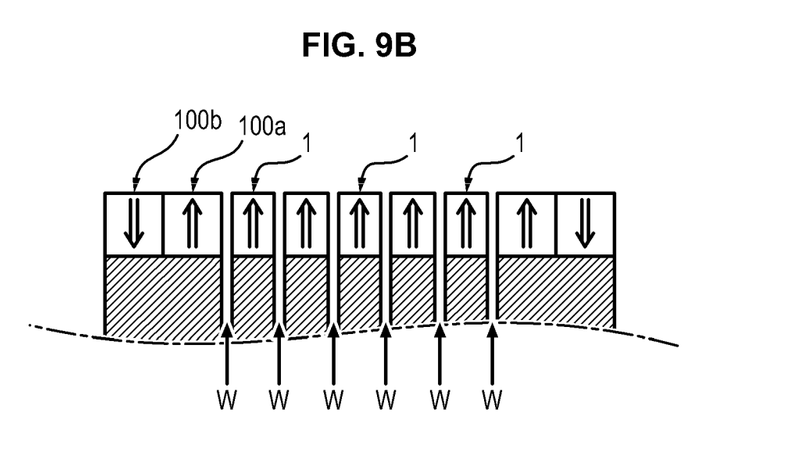
FIG. 9B is a section view of said array and of said magnetic structure.

According to a first option, it is provided that the magnetic structure 100a having axial magnetization concurrent with that of the single central magnet of each applicator 1 can fill the entire space between applicators, as illustrated in FIGS. 9A-9B. This embodiment can be applied very favorably to ion sources, and in particular to ion thrusters. According to a second option, possibly combined with the first one, a linear magnetic structure 100b with axial magnetization, but in the direction opposite to that of the single central magnet of each applicator 1, is positioned at the periphery of the applicator array 1 closing onto itself (see FIG. 9A-9B) so as to form, at the periphery of the applicator array, a so-called "magnetron" type magnetic structure where the electrons thus trapped in the peripheral magnetron structure 100a, 100b drift (magnetic drift) along the magnetic structure and are thus not lost on the walls.

Figure 10A:
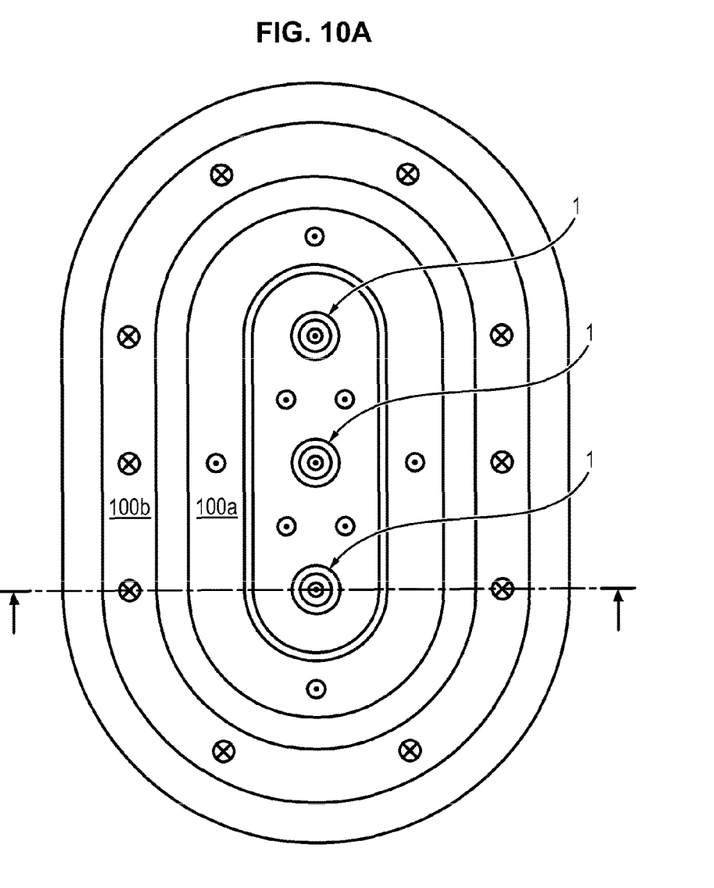
FIG. 10A is a top view of an array of applicators all having the same magnetization direction, surrounded by a sputtering magnetron structure.
Figure 10B:
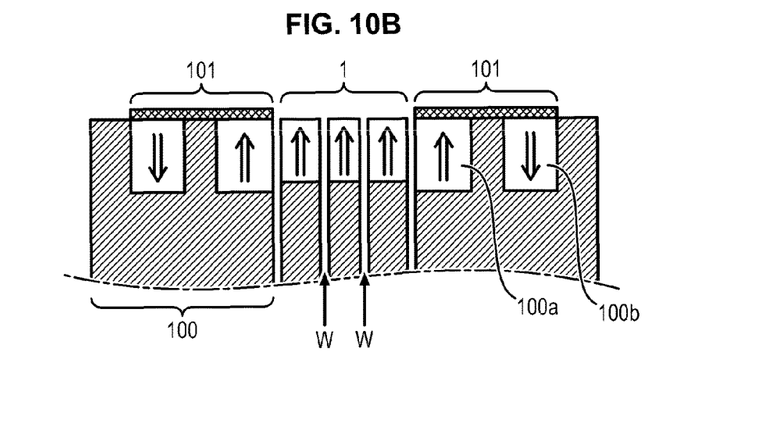
FIG. 10B is a section view of said array and of said magnetron structure.

A third option applicable to one and/or the other of the two embodiments presented above consists, within the scope of a microwave-plasma-assisted magnetron sputtering device, to surround the applicators with a magnetron sputtering structure (or conversely to surround a sputtering magnetron structure with applicators) so as to combine magnetron sputtering and ion assistance from the plasma created by the microwave applicators. Such a device is illustrated in FIGS. 10A-10B where a line of three applicators 1 with concurrent magnetization is surrounded by a sputtering magnetron structure 100.

In this case, the magnetron structure 100 can be negatively polarized (DC, radio-frequency (RF) or pulsed) relative to the ground to which the microwave applicators 1 are generally connected.

A target 101 is positioned above the magnetron sputtering structure 100. Moreover, if a moderate interaction is desired between the plasma produced by the applicators 1 and that produced by the magnetron structure 100, it is preferable to implement a magnetron structure with magnetization directions 100a, 100b indicated in FIG. 10B, that is with the structure 100a having the same magnetization direction as the applicators 1 directly adjoining said applicators, the structure 100b with opposing direction surrounding the structure 100a. In contrast, if a very strong interaction is desired, it is necessary to invert the magnetization direction of the magnets 100a, 100b of the magnetron structure 100 so as to pool the electrons arising from the plasmas produced by the magnetron structure 100 and by the microwave applicators 1. Depending on the application, configurations different or more complex than those indicated in FIGS. 9A-9B and 10A-10B can be implemented, but the same principles as those described above can be applied while still remaining within the scope of the invention.

Among the advantages provided by the invention will be noted, firstly, the energy effectiveness of the plasma produced, due both to reduction of losses of fast electrons on the surfaces of the applicator and reduction of losses by diffusion of the plasma produced toward the surfaces of the applicator. One advantage that results directly from the foregoing is the reduction in contamination arising from the surfaces of the applicator. Another advantage is the reduction in the power deposited on the surfaces of the applicator by the charged species of the plasma (fast electrons, thermal electrons, ions), hence the lesser need for cooling of the applicator.

Due to production and injection of the plasma ahead of the applicator, the device is extremely attractive both for improving the extraction of ions in ion sources (pre-acceleration of the ions), or for producing beams of neutralized ions in applications to ion propulsion. Finally, the fact of having a depletion of plasma between the applicator and the exit plane of the applicator favors, at low pressure, the propagation of microwaves to the ECR coupling region, hence a reduction in reflected power and a correlative improvement of the energy efficiency.

REFERENCES

FR 2 797 372
FR 2 838 020
FR 2 904 177
FR 2 904 178
FR 2 938 150
FR 2 840 451
M. Moisan and J. Pelletier, *Physique des plasmas collisionnels—Application aux décharges haute fréquence [Physics of Collisional Plasmas—Application to High-frequency Discharges]*, EDP Sciences, Collection Grenoble Sciences, Les Ulis, France (2006), page 215.

The invention claimed is:

1. A coaxial microwave applicator for plasma production, including an electrically conductive coaxial tube comprising a central core and of an outer conductor surrounding the central core and separated therefrom by an annular volume for propagation of microwaves, the applicator comprising:
    a cylindrical permanent magnet, magnetization whereof being parallel to an axis of the applicator, positioned at an end of the central core; and
    at least one annular permanent magnet, a magnetization direction whereof being parallel to the axis of the applicator, and concurrent with the magnetization of the central cylindrical magnet, positioned at an end of the outer conductor;
    wherein all the magnets positioned at an end of the coaxial tube have the same magnetization direction;
    wherein the magnetization of the magnets is selected so as to form a magnetic field suited to providing, in a region remote from an end of the applicator, electron cyclotron resonance coupling with a microwave electric field generated by the applicator; and
    wherein an outer radius and the magnetization of the annular magnet are further selected so that magnetic field lines generated by the magnets pass through the electron cyclotron resonance coupling region in a direction substantially parallel to the axis of the applicator, the outer radius of the annular magnet being at least twice the outer radius of the annular volume for propagation of the microwaves and a width of the annular volume for propagation of the microwaves being less than a radius of the central core.

2. The applicator according to claim 1, further comprising, around the annular magnet, called the first annular permanent magnet, a second annular permanent magnet, with axial magnetization concurrent with that of the central cylindrical magnet, the second annular magnet having a magnetic field intensity greater than that of the first annular magnet.

3. The applicator according to claim 2, wherein the first and second annular magnets consist of the same magnetic material and the length in the axial direction of the second annular magnet is greater than that of the first annular magnet.

4. The applicator according to claim 2, wherein the first and second annular magnets have the same length in the axial direction and the material of the second annular magnet has a higher magnetization than that of the first annular magnet.

5. The applicator according to claim 1, further comprising a shoulder covering an outer region of the end of the annular magnet, so as to limit radially the surface of the electron cyclotron resonance coupling region.

6. The applicator according to claim 1, wherein the central core and/or the outer conductor of the coaxial tube includes a circuit for circulating a cooling fluid.

7. The applicator according to claim 1, wherein the annular volume for propagation of the microwaves is sealed at the end of the applicator by a window made of a dielectric material.

8. The applicator according to claim 1, wherein the annular volume for propagation of the microwaves is sealed, upstream of the end of the applicator, by a window made of a dielectric material.

9. The applicator according to claim 7, wherein the annular volume for propagation of the microwaves is adapted for circulation of a dielectric cooling fluid.

10. A plasma production device, comprising an enclosure containing a plasma gas and at least one applicator according to claim 1, the end whereof bearing the cylindrical and annular permanent magnets leads into the enclosure.

11. The device according to claim 10, further comprising a plurality of applicators distributed within the enclosure so as to form a one-dimensional, two-dimensional or three-dimensional array.

12. The device according to claim 11, wherein the permanent magnets of the assembly have the same magnetization direction.

13. The device according to claim 12, wherein the applicator array is surrounded by a magnetic structure having a magnetization direction parallel to that of the applicators, but in the opposite direction.

14. The device according to claim 12, wherein the applicator array is surrounded by a sputtering magnetron structure.

15. The device according to claim 11, wherein the permanent magnets of all the applicators have alternating magnetization directions.

16. The device according to claim 10, wherein the absolute pressure inside the enclosure is comprised between $10^{-2}$ Pa and $10^3$ Pa.

17. A plasma production method using microwaves in an enclosure containing a plasma gas, comprising propagation of microwaves in a coaxial microwave applicator according to claim 1, leading into the enclosure and the application, at the end of the applicator, of a magnetic field suited to providing electron cyclotron coupling with the microwave electric field within a region remote from the end of the applicator, the lines of the magnetic field passing through the electron cyclotron resonance coupling region in a direction substantially parallel to the axis of the applicator.

18. The method according to claim 17, wherein the absolute pressure within the enclosure is comprised between $10^{-2}$ Pa and $10^3$ Pa.

19. The method according to claim 18, wherein the absolute pressure within the enclosure is less than 133 Pa.

20. The method according to claim 17, wherein plasma is produced by a plurality of applicators distributed within the enclosure so as to form a one-dimensional, two-dimensional or three-dimensional array.

21. The method according to claim 17, wherein the applicator is cooled by circulating a cooling fluid in the central core of the applicator or in the microwave propagation volume.

22. The method of claim 17, wherein the annular volume for propagation of the microwaves is sealed with a fluid-tight dielectric window at the end or upstream of the end of the applicator.

* * * * *